(12) United States Patent
Inanami et al.

(10) Patent No.: US 6,543,044 B2
(45) Date of Patent: Apr. 1, 2003

(54) METHOD OF EXTRACTING CHARACTERS AND COMPUTER-READABLE RECORDING MEDIUM

(75) Inventors: Ryoichi Inanami, Kawasaki (JP); Shunko Magoshi, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 34 days.

(21) Appl. No.: 09/814,996

(22) Filed: Mar. 23, 2001

(65) Prior Publication Data

US 2001/0037487 A1 Nov. 1, 2001

(30) Foreign Application Priority Data

Mar. 24, 2000 (JP) ........................ 2000-085363

(51) Int. Cl.[7] .................................................. G21K 5/10
(52) U.S. Cl. .......................................... 716/21; 716/19
(58) Field of Search .............................. 716/19, 20, 21, 716/1–18; 250/491.1, 492.1, 492.2, 492.22, 492.3

(56) References Cited

U.S. PATENT DOCUMENTS

| | | | | |
|---|---|---|---|---|
| 5,349,197 A | * | 9/1994 | Sakamoto et al. | 250/492.22 |
| 6,047,116 A | * | 4/2000 | Murakami et al. | 395/500.2 |
| 6,060,717 A | * | 5/2000 | Manabe et al. | 250/492.22 |
| 6,064,807 A | * | 5/2000 | Arai et al. | 716/21 |
| 6,192,510 B1 | * | 2/2001 | Yamada | 716/21 |
| 6,313,476 B1 | * | 11/2001 | Shimizu et al. | 250/492.22 |
| 6,317,866 B1 | * | 11/2001 | Tamura | 716/21 |
| 6,393,604 B1 | * | 5/2002 | Yamada et al. | 716/21 |
| 6,415,432 B1 | * | 7/2002 | Saito et al. | 716/21 |

FOREIGN PATENT DOCUMENTS

| | | |
|---|---|---|
| JP | 5-13313 | 1/1993 |
| JP | 5-182899 | 7/1993 |
| JP | 7-307262 | 11/1995 |

OTHER PUBLICATIONS

Shigehiro Hara et al.; "Character Projection EB Data Conversion System Combined With Throughput Analyzer", Jpn. J. Appl. Phys. vol. 33 (1994) pp. 6935–6939.

* cited by examiner

Primary Examiner—Tuan T. Lam
Assistant Examiner—Hai L. Nguyen
(74) Attorney, Agent, or Firm—Finnegan, Henderson, Farabow, Garrett & Dunner, L.L.P.

(57) ABSTRACT

Using the hierarchy cell5, cell51, cell52, cell4 of the figure cells in the design pattern data, it is not necessary to take the actual forms of patterns and the arrangement information of data (relation between patterns, period of arrangement) into consideration, and therefore, characters for CP exposure can be extracted effectively.

15 Claims, 5 Drawing Sheets

128k MEMORY CELL

```
                                          NUMBER OF
                                          ARRANGEMENTS
CellTop 157.8975, 162.6                                    ANGLE OF
   ┌cell0  (b:1,4) 1.71, 1.2............ 1        ┌ARRANGEMENTS
   │  ┌A   (b:1,2) 0.45, 0.3............ 1—180°  mirror
   │  ├B   (b:1,2) 0.45, 0.6............ 1—180°  mirror
   │  └B   (b:1,2) 0.45, 0.3............ 1               REVERSAL
   ├cell1  (b:1,4) 1.71, 0.6............ 1×261
   │  ┌A   (b:1,2) 0.45, 0.3............ 1—180°  mirror
   │  └A   (b:1,2) 0.45, 0.3............ 1
   ├cell2  (b:1,4) 1.71, 1.2............ 1
   │  ┌A   (b:1,2) 0.45, 0.3............ 1
   │  ├C   (b:1,2) 0.45, 0.3............ 1—180°  mirror
   │  └D   (b:1,2) 0.45, 0.6............ 1
   ├cell3  1.05, 1.2................... 128×1
   │  ┌A   (b:1,2) 0.45, 0.3............ 1—180°  mirror
   │  ├A   (b:1,2) 0.45, 0.3............ 1
   │  ├B   (b:1,2) 0.45, 0.6............ 1—180°  mirror
   │  ├B   (b:1,2) 0.45, 0.6............ 1
   │  ├E   (b:1,2) 0.45, 0.3............ 1—180°  mirror
   │  └E   (b:1,2) 0.45, 0.3............ 1
   ├cell4  1.05, 0.6................... 128×3
   │  ┌A   (b:1,2) 0.45, 0.3............ 2—180°  mirror
   │  └A   (b:1,2) 0.45, 0.3............ 2
   ├cell4  1.05, 0.6................... 128×2
   ├cell5  153.45, 153.6............... 1
   │  └cell51 38.25, 38.4.............. 4×4
   │     └cell52 19.05, 19.2........... 2×2
   │        └cell4 1.05, 0.6........... 16×32
   ├cell6  1.05, 1.2................... 128×1
   │  ┌A   (b:1,2) 0.45, 0.3............ 1—180°  mirror
   │  ├A   (b:1,2) 0.45, 0.3............ 1
   │  ├C   (b:1,2) 0.45, 0.3............ 1—180°  mirror
   │  ├C   (b:1,2) 0.45, 0.3............ 1
   │  ├D   (b:1,2) 0.45, 0.6............ 1—180°  mirror
   │  └D   (b:1,2) 0.45, 0.6............ 1
```

FIG. 4A

```
┌ cell7  (b:1,4)  2.31,1.2..........  1
│  ├─A  (b:1,2)  0.45,0.3..........  1-180°  mirror
│  ├─A  (b:1,2)  0.45,0.3..........  1
│  ├─B  (b:1,2)  0.45,0.6..........  1-180°  mirror
│  ├─B  (b:1,2)  0.45,0.6..........  1
│  ├─E  (b:1,2)  0.45,0.3..........  1-180°  mirror
│  └─E  (b:1,2)  0.45,0.3..........  1
├ cell8  (b:1,4)  2.31,0.6..........  1×261
│  └cell4  1.05,0.6..........  1
├ cell9  (b:1,4)  2.31,1.2..........  1
│  ├─A  (b:1,2)  0.45,0.3..........  1-180°  mirror
│  ├─A  (b:1,2)  0.45,0.3..........  1
│  ├─C  (b:1,2)  0.45,0.3..........  1-180°  mirror
│  ├─C  (b:1,2)  0.45,0.3..........  1
│  ├─D  (b:1,2)  0.45,0.6..........  1-180°  mirror
│  └─D  (b:1,2)  0.45,0.6..........  1
├ hkds0  (b:1,13)  1.71,1.725........  1
│  └─F  (b:1,6)  0.45,0.74.........  2
├ hkds1  (b:1,12)  1.8375,1.875......  1
│  └─F  (b:1,6)  0.45,0.74.........  1-180°
├ hkds2  0.86,0.985...............  128×1
│  ├─G  (b:1,3)  0.26125,0.985.....  1-180°  mirror
│  └─G  (b:1,3)  0.26125,0.985.....  1
├ hkds3  1.05,0.74...............  128×1
│  ├─F  (b:1,6)  0.45,0.74.........  1-180°  mirror
│  └─F  (b:1,6)  0.45,0.74.........  1
├ hkds4  1.05,0.74...............  128× mirror
│  ├─F  (b:1,6)  0.45,0.74.........  1-180°
│  └─F  (b:1,6)  0.45,0.74.........  1 mirror
├ hkds5  0.86,1.135...............  128×1
│  ├─H  (b:1,3)  0.26125,1.135.....  1-180°  mirror
│  └─H  (b:1,3)  0.26125,1.135.....  1
├ hkds6  (b:1,16)  2.31,1.725.......  1
│  └─F  (b:1,6)  0.45,0.74.........  1-180°  mirror
└ hkds7  (b:1,11)  2.31,1.875.......  1
   └─F  (b:1,6)  0.45,0.74.........  1-180°
```

FIG. 4B

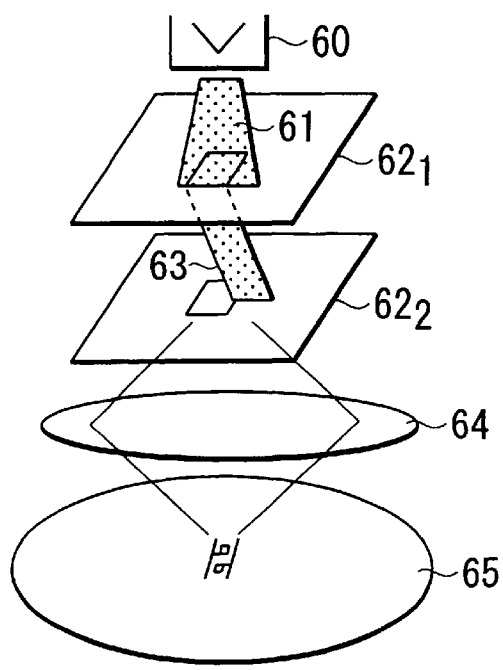
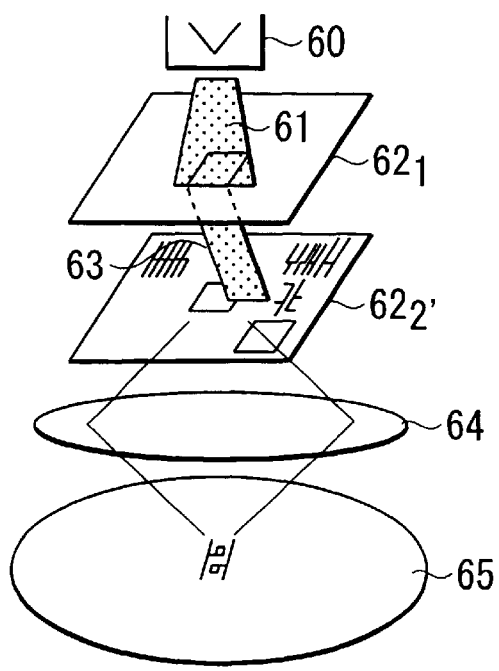
FIG. 5  FIG. 6
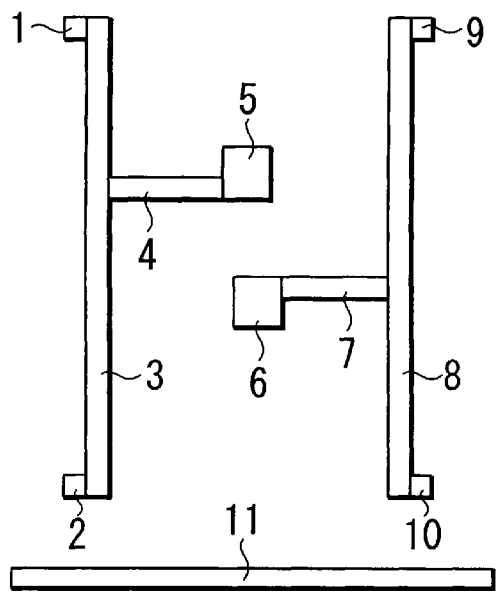
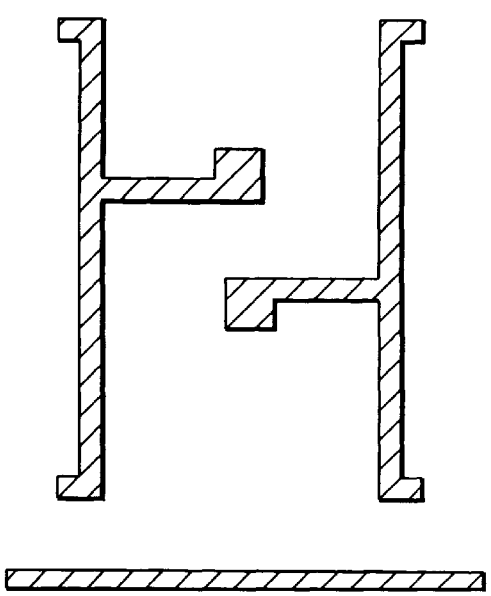
FIG. 7A  FIG. 7B

METHOD OF EXTRACTING CHARACTERS AND COMPUTER-READABLE RECORDING MEDIUM

CROSS-REFERENCE TO RELATED APPLICATIONS

This application is based upon and claims the benefit of priority from the prior Japanese Patent Application No. 2000-085363, filed Mar. 24, 2000, the entire contents of which are incorporated herein by reference.

BACKGROUND OF THE INVENTION

An electron beam exposure technique is indispensable to the semiconductor processing technique in which more and more miniaturized semiconductor devices are manufactured. In a variable shaping beam (VSB) exposure method which is a representative electron beam exposure method, as shown in FIG. 5, an electron beam 61 from an electron source 60 is shaped by means of combined beam shaping apertures $62_1$ and $62_2$ having two quadrilateral electron beam permeation windows respectively in order to divide an exposure pattern into minute rectangles and exposure is performed by shooting these rectangles one by one, and therefore, many shots are required, and as a result thereof, there arises problem of a prolonged exposure time and a lowered throughput. Further, in the figure, 63 designates an electron beam after being shaped by means of the beam shaping aperture $62_1$, 64 a reduction lens 64, and 65 a specimen.

So, a character projection (CP) exposure technique permitting a pattern of a given size to be shot at a time has been developed. As shown in FIG. 6, the electron beam exposure apparatus of CP system shapes an electron beam 61 into a rectangle by means of a beam shaping aperture $62_1$, selects any character from a plurality of characters formed on a character aperture $62_2'$, shapes an electron beam 63 shaped into the rectangle into a desired character form, and exposes a desired portion of the specimen 65.

The CP exposure technique permits a batch exposure to a pattern several micrometer square by shaping an electron beam irradiated to the specimen by means of a character aperture having a permeation window of a desired form. Thereby, conventional several VSB exposures can be replaced with only one CP exposure and the number of shots of electron beams can be reduced.

For example, in a pattern shown in FIGS. 7A to 7B, according to VSB system, the pattern is divided into 11 rectangles and beams are shaped into these rectangular forms sequentially, thereby performing exposures, and therefore, exposures are repeated 11 times (FIG. 7A). In contrast thereto, according to CP system, if this pattern is not larger than the maximum size of electron beams, only one exposure will be required and the exposure time to this pattern is reduced to 1/11 (FIG. 7B).

However, the number of characters is limited to the number falling within the deflection area of an electron beam, it is impossible to prepare characters for exposing a complicated semiconductor device, and therefore, with regard to several patterns applied to repeated exposures, the CP exposure is performed by using a character aperture, and with regard to the remaining patterns, the VSB exposure is performed.

The conventional exposure apparatus of CP system can use character apertures, however, the development of an exposure apparatus capable of using one to several hundreds characters is also planned.

However, in a semiconductor device including others than simple and repeatedly exposed portions such as a memory cell, if one device chip is exposed completely by means of the CP system, the number of characters is still insufficient, and it is necessary to extract a pattern for CP exposure as characters among device patterns for exposure so that the number of characters and the number of shots may be the smallest.

This method of extracting characters includes, for example, a method of extracting periodical relations of the characters arranged in the pattern to the arrangement positions thereof and the adjacent characters and employing them as characters for CP exposure.

However, it requires a great deal of time to flatten a hierarchy in design pattern data, to examine the number of exposures and the periodicity of arrangement positions from a vast number of figure data and to examine the relation between a plurality of figures, and even if a computer is used, the processing time therefore will be enormous. Therefore, no characters for CP exposure can be extracted effectively.

As another method of extracting characters there is a method of defining the performance of a CP exposure in a given pattern in the design stage.

However, in cases of the patterns in which no characters for CP exposure are specified in the design stage or the patterns which are not contained in the library, all the exposures must be performed according to the VSB system, and therefore, even if an apparatus for CP exposure is provided, there will be no merits. Accordingly, also in this case, no characters for CP exposure can be extracted effectively.

In addition thereto, there are a method of extracting characters for CP exposure manually, a method of preparing a library of patterns for CP exposure in advance and allocating the patterns defined in the library to the characters for CP exposure in converting pattern data into exposure data, and a method of extracting a plurality of repeated units in a pattern expressed in the same repeated characters such as a line & space pattern as characters for CP exposure falling within the repeated unit or the shot size in exposure, while all these methods have, as the methods described above, a problem that no characters for CP exposure can be extracted effectively.

BRIEF SUMMARY OF THE INVENTION

It is an object of the present invention to provide a method of extracting characters permitting an effective extraction of characters for CP exposure and a computer-readable recording medium.

Among the inventions disclosed in this application, the summary of a representative one will be described briefly below.

That is, in order to achieve the above-described object, the method of extracting characters according to the present invention comprises a first step of preparing design data having a hierarchy with regard to figure cells which are design data of a device pattern for exposure and a second step of extracting candidates for the figure cells corresponding to the characters from all levels of figure cells in the design pattern data by using a hierarchy with regard to the figure cells in the design pattern data so that at least one of the number of kinds of characters or the number of shots of electron beams as a unit in performing an electron beam exposure of character projection system may be the smallest when the exposure is performed using at least one part of the device pattern.

Due to such a composition, it is not necessary to take the actual forms of patterns and the arrangement information of data (relation between patterns, period of arrangement) into consideration by using the hierarchy with regard to the figure cells contained in the design pattern data, and therefore, characters for CP exposure can be extracted effectively.

The above and other objects and the novel features of the present invention will be apparent from the description of this specification and the accompanying drawing.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 4A and 4B are views showing the number of shots of a STRUCTURE composition of the pattern data, pattern data, external form sizes, number of arrangements, angle of arrangements, reversed arrangements and a STRUCTURE having BOUNDARIES defined in the pattern data;

FIG. 5 is a view for illustrating an exposure method of variable shaping beam system;

FIG. 6 is a view for illustrating an exposure method of character projection system; and FIGS. 7A to 7B are views for illustrating the advantages of the exposure method of character projection system.

DETAILED DESCRIPTION OF THE INVENTION

Figure 1A:
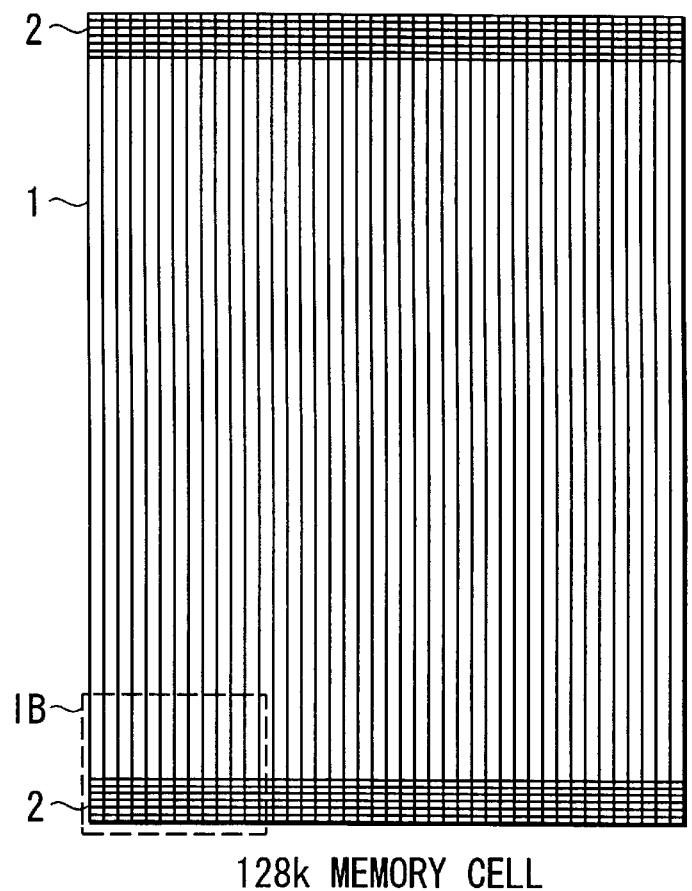
FIGS. 1A to 1B are schematic views showing patterns to which a specimen is to be exposed.

Now, embodiments of the present invention will be described with reference to the drawing.

(1st Embodiment)

According to the present invention, in an electron beam exposure method of character projection (CP) system in which an electron beam is shaped into a desired form by means of an aperture having a permeation window of a desired form and in which a specimen is irradiated and exposed, when characters as a unit for performing exposure are extracted from the design data of exposure patterns, in particular, of minute patterns of submicrometer or less, the number of characters required for exposure to patterns is calculated and the number of shots of exposure is estimated.

In the above-described calculation method, the number of characters required for exposure to a figure in each level in the pattern data and the number of shots of exposure are calculated, characters are selected therefrom within the number of characters which can be employed for exposure so that the total number of shots may be the smallest, and the exposure to the other characters excluded from the selection is performed by means of the conventional variable shaping beam (VSB) system.

In order to perform an exposure of CP system, it is necessary to dispose a beam shaping mask (character aperture) for shaping an electron beam into a character form required for the exposure in the electronic optical system. Permeation bores having the forms of the characters for CP exposure extracted by means of the above-described method are formed on a character aperture and one or more rectangular permeation windows for VSB beam shaping are disposed, thereby permitting an exposure of CP system as described above.

As a result thereof, the number of characters required for exposure and the number of shots thereof can be reduced, thereby to permit an improved throughput in the electron beam exposure to be achieved.

Now, the embodiment of the present invention will be described specifically. The present inventor calculated the number of kinds of characters and the number of shots required when the exposure of a gate layer (gate electrodes, gate wires) of 128 k bit memory cell was performed by means of the CP exposure, calculated the number of shots required when the VSB exposure was performed, and compared the CP exposure with the VSB exposure. The above-described calculation was performed using the pattern data of an actual memory cell. Here, the calculation was performed assuming that the maximum size of electron beams which could be irradiated onto the specimen was 10 $\mu m^\bullet$.

FIG. 1A is a schematic view showing the patterns used. The cell array 1 is a line & space pattern, that is, a typical pattern having a draw-out portion 2 of a characteristic form on both ends thereof.

Figure 1B:
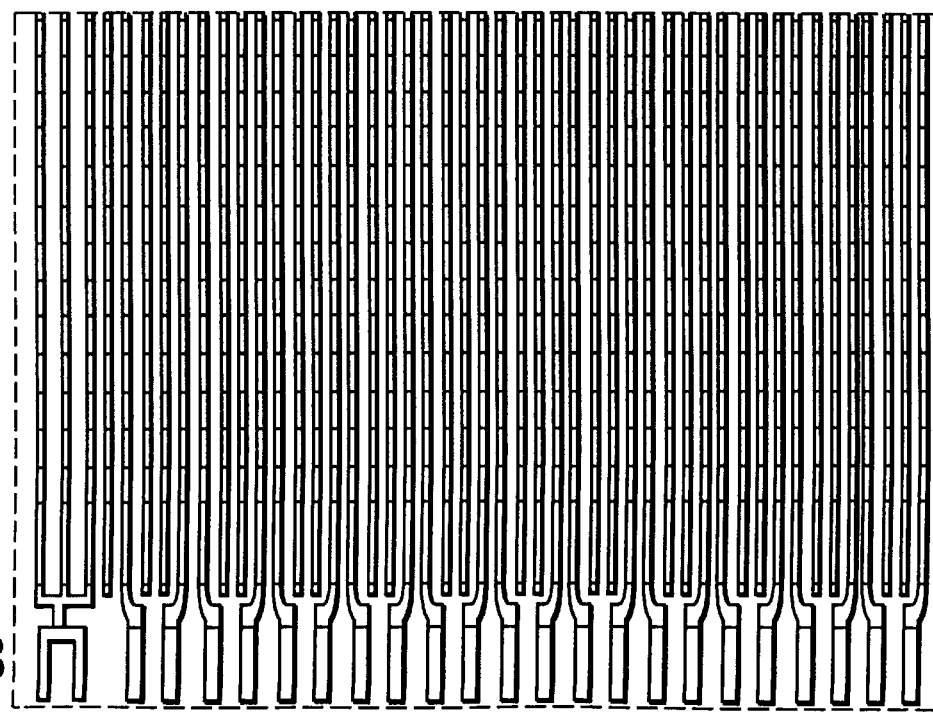

Here, as shown in FIG. 1B, an enlarged view shows what kinds of patterns are used, and it seems easy to judge which pattern is to be extracted as characters for CP exposure. However, actually, even if the patterns are simple as shown in the figure, it is relatively difficult to calculate how a pattern is to be cut into characters after having taken the forms and arrangement positions of all the patterns into consideration, and the amount of calculations is large even in calculations on the computer.

This embodiment shows that the calculations can be performed by means of an optimal method without taking the form of an arranged pattern, the arrangement position and the correlation with the other patterns into consideration. As design data (pattern data) of a device pattern for exposure, generally used ones of GDSII STREAM format are used.

In the pattern data of this form, several figure cells are named and defined, any number of single reference arrangements locating only one of these figure cells at a specified position and of array reference arrangements locating a specified number of figure cells in an array form are arranged to create a tree structure of figure cells hierarchically.

Each figure cell includes, in addition to the above-described reference arrangements, apex coordinates of polygons, line segments and line patterns connecting the line segments, as actual figure data. The figure cell itself is called a STRUCTURE, the single reference arrangement a SREF, the array reference arrangement an AREF, the polygon a BOUNDARY, and the line pattern of a PATH.

Figure 2:
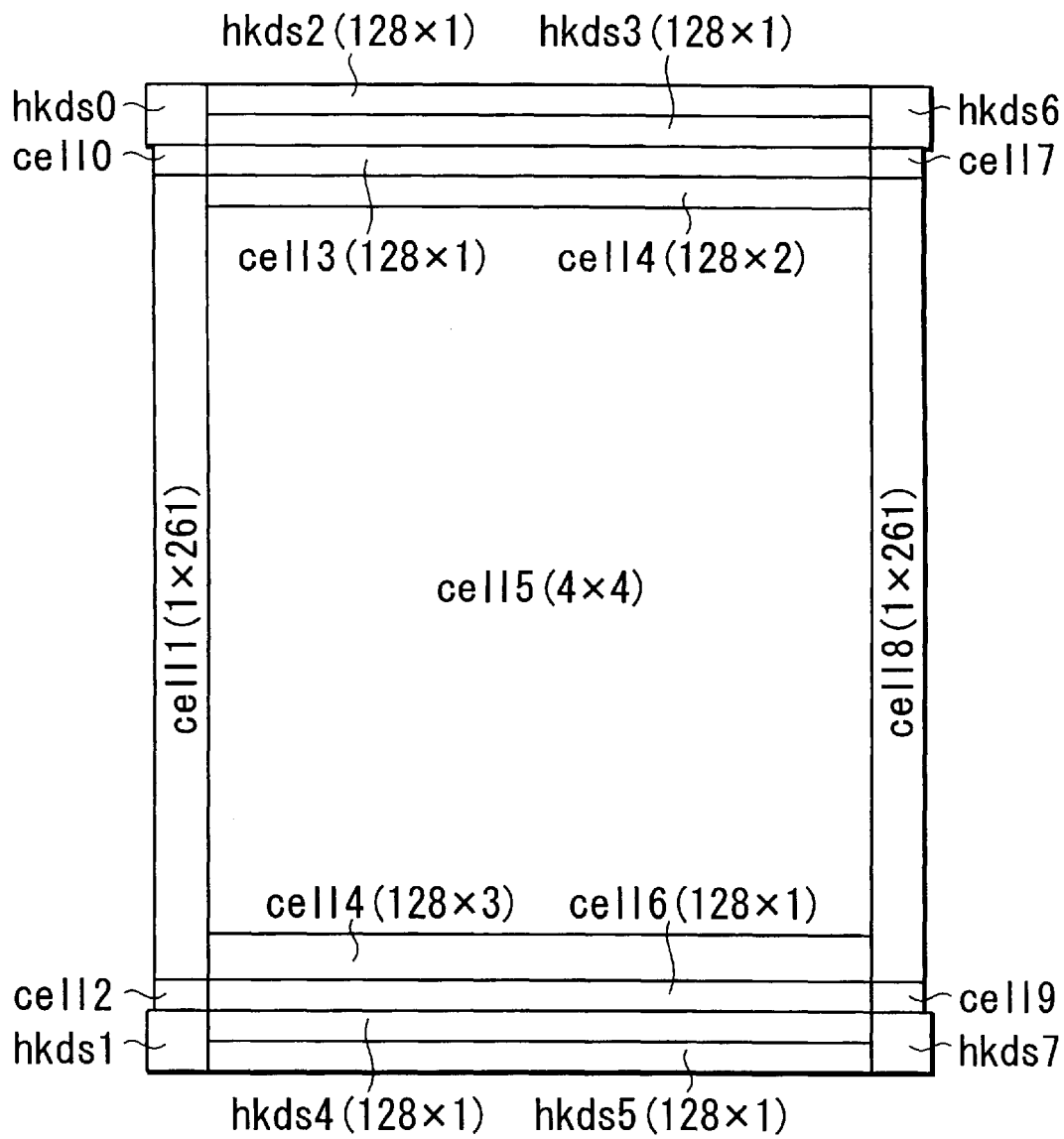
FIG. 2 is a view showing an example of the arrangement of STRUCTURES defined in the pattern data.

FIG. 2 shows an example of the arrangement of the STRUCTURES defined in the pattern data. The STRUCTURES shown in the figure are arranged on the STRUCTURE of the top level (Cell Top) by means of the SREF and the AREF, and cell0, cell1 and the like can be called STRUCTURES of one level below. Of course, several STRUCTURES and BOUNDARIES are arranged on these STRUCTURES to create a hierarchy of STRUCTURES thereby.

FIG. 2 shows the external form of each STRUCTURE in a rectangle, wherein the names given to the STRUCTURES and the numbers of repeated arrangements by means of the AREF in "(column×row)" are shown respectively. The STRUCTURES without the number of arrangements are the ones arranged by means of the SREF.

Figure 3:
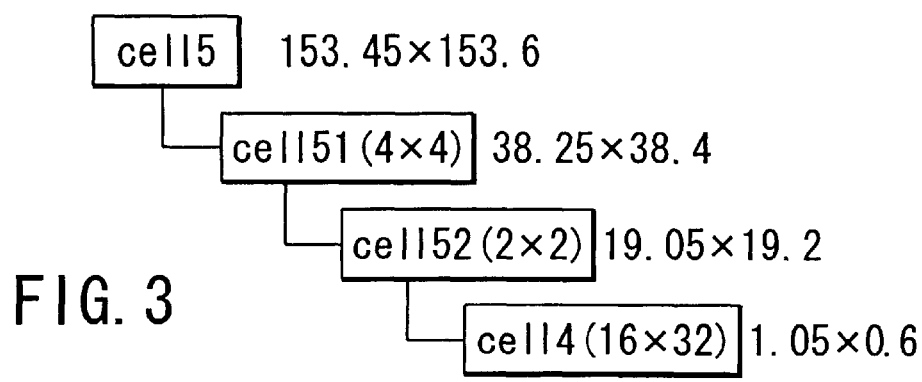
FIG. 3 is a view showing the hierarchy of the STRUCTURES of cells and below.

Moreover, FIG. 3 shows the hierarchy of STRUCTURES of "cell5" and below occupying a large part of the central cell array portion. Among the values entered behind the STRUCTURES, the ones not enclosed in "( )" show the external form sizes of the figure cells in $\mu$m respectively. The cell4, as shown in FIG. 2, is arranged also at other positions.

Now, a method of extracting characters using the pattern data of FIG. 2 will be described.
[Step 1]
Firstly, with regard to all figure cells (STRUCTURES) included in the pattern data shown in FIG. 2, the external form sizes, the numbers of kinds of characters in CP exposure, as well as the numbers of shots in CP exposure and VSB exposure are found respectively by means of calculations.

FIGS. 4A and 4B show STRUCTUREs composition of the pattern data shown in FIG. 2, and numbers of kinds of characters in CP exposure, as well as the external form sizes (width×height), the numbers of kinds of characters, angle of arrangements, reversed arrangements, and further the number of shots in CP exposure and VSB exposure in the form of "b: number of CP shots, number of VSB shots" with BOUNDARIES.

Since no flattening of the levels of the STRUCTURES (development of the STRUCTURES arranged by means of the SREF and the AREF) is performed, the above-described calculations of the external form sizes and the like can be carried out relatively simply and in a short time.

It is found that the STRUCTURES (Cell Top) are composed of combinations of 8 kinds of STRUCTURES "A" to "H" composed of only BUNDARIES and of 9 kinds of STRUCTURES including BOUNDARIES together with reference arrangements. Since these STRUCTURES are designed in very small sizes and are all smaller than the beam sizes, 17 kinds of characters are sufficient for CP exposure.

However, when the number of shots by means of the VSB and the number of shots by means of the CP exposure using the above-described method are found respectively, the results of:

VSB 280,292
CP (17 kinds) 138,311 are obtained, and these results show that the number of shots can be reduced only to about half as large as that in case of the VSB even if the CP exposure is performed.
[Step 2]
Using the hierarchy of the STRUCTURE (Cell Top) in the Step 1, all levels are observed sequentially from the top level to judge which STRUCTURE is to be extracted as characters for the CP exposure. Here, it is assumed that the relation between different STRUCTURES arranged on the same STRUCTURE is unknown, and STRUCTURES having different names or those having the same name, but rotated or reversed are treated as different characters.

Accordingly, in this case, all the STRUCTURES arranged on the "Cell Top" are judged to have quite different forms and are allocated to other characters.

Since all the STRUCTURES have a size of 10 $\mu$m• or less except "cell5", they are extracted as one kind of character respectively. For example, in case of cell0, a pattern composed of a BOUNDARY included in cell0 and a BOUNDARY of "A" arranged for reference and "B" arranged in two ways is treated as one character.
[Step 3]
Now, it is determined how cell5 which cannot be extracted as one character is used for the CP exposure.

From FIG. 3 and the result of Step 1 it is found that cell5 is composed of an array arrangement of 4 rows×4 columns of cell51. Since cell51 has a size of 38.25 $\mu$m×38.4 $\mu$m, 16 shots of 4 rows×4 columns are found by dividing this size by a beam size of 10 $\mu$m•. At this stage, since the kinds of characters required for the CP exposure to cell51 are unknown, a maximum of 16 kinds of characters are necessary.

When cell51 is employed as characters for the CP exposure, the number of shots required for the exposure to cell5 is 16×(4×4)=256 shots.
[Step 4]
Further, in a level below cell51, cell52 has a size of 19.05 $\mu$m×19.2 $\mu$m, which is equivalent to 4 shots, and therefore, when cell52 is extracted as characters for the CP exposure, the number of kinds of characters (CPs) required for the exposure to cell5 are a maximum of 4, and the number of shots is equal to 4×(2×2)×(4×4)=256 shots.

When cell4 below cell52 is employed as characters for the CP exposure, the kinds of Characters and the number of shots are both 1, however, since cell4 is arranged 16×32× 512 times on cell52, 1×512×4×16×32,768 shots are required for the exposure to cell5, and hence, it has a larger effect of reducing the number of shots to extract cell52 as characters for the CP exposure.

[Step 5]

Here, since cell52 is composed of only an array arrangement of cell4s and references are made even times both in the longitudinal and transverse directions (references are made non-prime times), a maximum of 4 kinds of characters judged only from the size of cell52 means that one kind of character is sufficient.

[Step 6]

Moreover, for pattern data of GDSII STREAM format, in case of performing an array arrangement by means of AREF, the external form size after the array arrangement as well as the number of longitudinal and transverse arrangements are specified respectively to be able to find the longitudinal and transverse spaces (pitches) of the arrangements easily.

Using this information, for example, with regard to cell1, since the external form size thereof when AREF is specified is 1.8 $\mu$m×156.6 $\mu$m and cell1 is arranged 1×261 times, it is found that the longitudinal pitch is 0.6 $\mu$m. Here, there are provided three methods of allocation to characters for the CP exposure as described below:

1. A pattern repeated about several times of the number of references is selected as characters so that there may be no remainder even if the CP exposure is repeated;
2. When a maximum number of STRUCTURES falling within the maximum beam size are extracted as one character and there is any remainder which cannot be used for the CP exposure, the remainder is used as new (other) characters for the CP exposure; and
3. In case of No. 2, the exposure to the remainder is performed by means of the VSB.

With regard to these cases, the number of kinds of CP characters and the number of shots required for the exposure to the pattern of cells 1 arranged in an array will be estimated.

Firstly, in case of No. 1, since the number of times of repetition is equal to 261×9×29, a pattern in which 9 or 29 cell1s are connected to each other in a pitch of 0.6 $\mu$m can be employed as characters for the CP exposure. Accordingly, since the beam has a size of 10 $\mu$m•, a pattern in which 9 cell1s are connected to each other is employed as characters. At this time, the number of CP characters is 1 and the number of shots is 29.

Now, in case of No. 2, a maximum of 16 cell1s can be included in the beam of 10 $\mu$m. The number of cell1s which can be used for the CP exposure is a maximum of 16×16× 256, and the remaining 5 cell1s are in excess. Accordingly, the number of character is 2 and the number of shots is 17.

Finally, in case of No. 3, when the exposure to cell1 is performed by means of the VSB system, the number of shots is 8, and therefore, it is found that 16+8×5×56 shots are required. In this case, the number of characters is 1.

Accordingly, it is found preferable to select the first method for preventing the number of characters from increasing and to select the second method for keeping the number of shots as small as possible.

[Step 7]

Also with regard to other 9 STRUCTURES arranged by means of AREF, calculations are performed similarly as in Step 6. Since there is no remainder, for example, in hkds2, the CP exposure can be performed in 16 shots using one kind of character.

The results of the calculations performed as described above will be shown in Table 1.

TABLE 1

EXTRACTION OF CP CHARACTERS AND
Calculation Results of Number of Shots

| STRUCTURE | Number of Characters | CP Shot | VSB Shot |
|---|---|---|---|
| cell0 | 1 | 1 | 10 |
| cell1 | (case1)1 | 29 | 8 × 261 |
|  | (case2)2 | 17 |  |
| cell2 | 1 | 1 | 4 |
| cell3 | 1 | 16 | 12 × 128 |
| cell4 | 1 | 16 | 8 × 384 |
| cell4 | 1 | 16 | 8 × 256 |
| cell5 | 1 | 256 | 8 × 32,768 |
| cell6 | 1 | 16 | 12 × 128 |
| cell7 | 1 | 1 | 16 |
| cell8 | (case1)1 | 29 | 12 × 261 |
|  | (case2)2 | 17 |  |
| cell9 | 1 | 1 | 16 |
| hkds0 | 1 | 1 | 25 |
| hkds1 | 1 | 1 | 18 |
| hkds2 | 1 | 16 | 6 × 128 |
| hkds3 | 1 | 16 | 12 × 128 |
| hkds4 | 1 | 16 | 12 × 128 |
| hkds5 | 1 | 16 | 6 × 128 |
| hkds6 | 1 | 1 | 22 |
| hkds7 | 1 | 1 | 17 |
| Total | (case1)19 | 450 | 280,292 |
|  | (case2)21 | 426 |  |

Two kinds of values are shown in cases of No. 1 and No. 2 of Step 6. From these results it is found that in order to perform an electron beam exposure to the 128 k memory cell pattern used at this time by means of the CP system 19 and 21 kinds of characters are required for the CP exposure, that the numbers of shots of the CP exposure are 450 and 426 respectively, and that the number of shots can be reduced to 1/620 through 1/660 in comparison to 280,292 in case of the exposure being performed by means of the VSB system.

In the method of extracting CP exposure characters used in this embodiment, since characters can be extracted without developing the form of a pattern, the mutual relations among a plurality of patterns and the figure cells arranged for reference in the figure cells in the pattern data, a simplified processing on the computer performing this work and a shortened data processing time can be achieved. In other words, by using this extraction method, characters for the CP exposure effectively can be extracted by means of a simple algorithm and that with a small load on the computer.

Moreover, since the hierarchy of the figure cells is basically composed of reference arrangements, it is easy to pick out the extracted character patterns as independent patterns or to create pattern data from which the extracted portion has been removed, and therefore, for example, when the exposure to the patterns remaining after having extracted the patterns for the CP exposure is performed by means of VSB, VSB pattern data must be created, however, the processing for the work can be simplified substantially.

Moreover, no patterns in the figure cells are divided or integrated with other patterns, and therefore, even if recalculations are performed under changed conditions, for example, in case of another beam size which can be irradiated, optimized extractions of the patterns and calculations of the number of shots can be achieved more easily by using the results of the previous calculations.

Now, another embodiment of the present invention will be described with emphasis on the differences from this embodiment, and the matters described in this embodiment such as apparatus used, effects and advantages will be omitted if not needed.

(2nd Embodiment)

In the above-described embodiment 1, there is described the method of pattern extraction permitting a reduced number of shots by extracting characters for the CP exposure from the pattern data of a device without examining the forms and arrangement information of the pattern in detail. In this embodiment there will be described a method of pattern extraction permitting reduced numbers of kinds of characters and shots from the design pattern data of a device without examining the forms and arrangement information of the pattern in detail.

That is, in this embodiment, there will be described a method of reducing the number of characters for the CP exposure and the number of shots by arranging the extracted characters into groups using only the reference arrangement information (arrangement position coordinates in the single arrangement, as well as external form size and number of repetitions after array arrangement in the array arrangement) described in the pattern data and the external form size of each arranged figure found by means of calculations.

[Step 1]

Characters for the CP exposure are extracted by means of the techniques of Steps 1 to 7 in Embodiment 1. Here, in cell1 and cell8, either case 1 or case 2 may be applied.

[Step 2]

By referring only to the arrangement information of the STRUCTURES composing the characters extracted in Step, it is examined if the plurality of extracted characters can be grouped together into one character.

Although the hierarchy of the STRUCTURES shown in FIG. 2 is complicated, the arrangement of the characters extracted therefrom is relatively simplified. So, for example, hkds0 and cell0 are both arranged only once by means of SREF and they are arranged in contact with the top level.

The external form sizes of these two STRUCTURES are found to be equal to or smaller than the maximum beam size. Accordingly, when these are defined again as one character, the number of characters of 2 and the number of shots of 2 are reduced to the half and become 1 respectively.

In order to perform such an examination, since the coordinates arranged by means of SREF are described in the data of GDSII STREAM format, candidates for the characters to be easily grouped together can be obtained by sorting and arranging the STRUCTURES according to the arrangement coordinates thereof. By means of this method it can be examined if the STRUCTURES arranged by means of SREF can be grouped together into a character for the CP exposure.

As a result thereof, cell0 and hkds 0, cell2 and hkds 1, cell7 and hkds 6, as well as cell9 and hkds 7 are defined again as one character respectively, and in comparison to the result of Embodiment 1 the number of characters can be reduced by 4, and the number of shots can be also reduced by the number of 4 times.

[Step 3]

Now, the characters composed of the STRUCTURES arranged in an array by means of AREF in a pattern of GDSII STREAM format are examined. In this case, by sorting the STRUCTURES according to the arrangement coordinates thereof similarly as in case of SREF in Step 2, STRUCTURES capable of being grouped together into a character are searched. At the same time, STRUCTURES of which areas arranged in an array have the same width or the same height are extracted as candidates. As described in first Embodiment, since the areas arranged by means of AREF are described in the pattern data, this work can be also performed easily.

1. Cell1 and cell8 are arranged longitudinally in an array of 261 pieces and have the same Y coordinate in the areas where they are arranged, however, since they are transversely spaced from each other, a portion of them cannot be grouped together for the CP exposure.

2. The portions of hkds 2, hkds 3, cell3, cell4, cell5 (cell52s arranged in an array of 8×8), cell4, cell6, hkds 4 and hkds 5 arranged in an array have the same X coordinate in the areas where they are arranged, and at the same time they have the same width.

3. Among these STRUCTURES, cell4s are arranged above and below the portion of cell5, and cell5 is composed of cell4s arranged in an array of 128×256, however, when the calculations are developed into the STRUCTURES of a lower level as described above, the amount of calculations increases and a large load is applied to the processing, and therefore, such a development shall not be employed. Accordingly, the portion of cell5 is regarded as further more undividable, and as a result thereof, it is to be judged that the portion of cell5 cannot be grouped together with cell4s above and below for the CP exposure using the same character.

4. Among the STRUCTURES having the same width and transverse position in the array arrangements described above, since it is found that the portion of cell5 cannot be grouped together into a character for the CP exposure, a group of hkds 2, hkds 3, cell3 and cell4 as well as a group of cell4, cell6, hkds4 and hkds5 above and below the portion of cell5 remain as candidates. These groups are spaced from each other by more than the maximum beam size at the portion of cell5, what shows that it is to be examined if the characters of each of these two groups can be grouped together.

5. When looking at the external form size of each of the groups, the height thereof in the longitudinal direction in which no repeated arrangements are performed is equal to or smaller than the maximum beam size, what shows that the heights of these two groups may be grouped together respectively in the longitudinal direction for the CP exposure repeatedly in the transverse direction using the same character.

6. If the height of the external form size composed of 4 STRUCUTRES is larger than the maximum beam size, these STRUCTURES may be further divided into a plurality of groups.

7. With regard to each of the groups above and below cell5 composed of 4 STRUCTURES in this case, the number of transverse repetitions of each of the 4 STRUCTURES is 128, what shows that each STRUCTURE arranged in the longitudinal direction is to be defined again as one character and that the exposure is to be repeated 128 times in the transverse direction. In Steps 6 and 7 of the first Embodiment, since 8 STRUCTURES are converted as one character into an array arrangement of 16×1, the number of kinds of characters and the number of shots of 16 (shots)×4 kinds are required, while in this case the number of kinds of characters and the number of shots can be reduced to 16 shots×1 kind.

8. In this case the numbers of repetitions are all the same, however, in order to judge if grouping between different AREFs is possible, a common divisor of each number of repetitions is to be searched. If there is any common divisor, the STRUCTURES can be grouped together and converted into the shots of characters of the number of times of the common divisor.

The effect of reducing the number of kinds of characters (CPs) for the CP exposure and the number of shots obtained with this embodiment will be shown in Table 2.

TABLE 2

Calculation Results of Number of Characters and Number of Shots Due to Grouped Characters

| Grouped STRUCTURE | Number of Kinds of CPs | | Number of Shots | |
|---|---|---|---|---|
| | Embodiment 1 | Embodiment 2 | Embodiment 1 | Embodiment 2 |
| hkds0 cell0 | 2 | 2 | 2 | 1 |
| cell2 hkds1 | 2 | 2 | 2 | 1 |
| hkds6 cell7 | 2 | 2 | 2 | 1 |
| cell9 hkds7 | 2 | 2 | 2 | 1 |
| hkds2 hkds3 cell3 cell4 | 4 | 4 | 64 | 16 |
| cell4 cell6 hkds4 hkds5 | 4 | 4 | 64 | 16 |
| Total Number of Reduction | 10 | | 100 | |

Table 2 shows that this embodiment can reduce the number of kinds of characters for the CP exposure by 10 and the number of shots by 100. That is, Number of VSB shots: 280,292

→Case 1 9 kinds 350 shots

Case 2 11 kinds 326 shots indicates that the number of shots can be reduced to 1/800 or less of the VSB exposure.

In this embodiment, only by adding the information concerning the reference arrangement described in advance in the pattern data to the method of extracting characters of the first embodiment, the number of characters and the number of shots can be further reduced.

Since also the method of extracting characters of this embodiment can unify characters into groups by calculating only the external form size of a figure and define the figure again effectively by repeating the repetition unit of array arrangements a plurality of times, the number of characters and the number of shots can be reduced very effectively with the load applied to data processing being kept to a minimum. Further, also in this method of extracting characters, since the figures grouped together into groups can be recomposed only by defining the reference arrangement information of the figure cells defined respectively in the design pattern data, the pattern data can be generated simply and effectively.

(Embodiment 3)

In this embodiment, there will be described a method of extracting characters using a method of determining which patterns are to be used as characters for the CP exposure and which patterns are to be exposed by means of VSB when the number of characters which can be extracted as characters for the CP exposure is limited due to the limits of an exposure apparatus on the assumption that patterns unsuitable for the CP exposure are used for the exposure by means of the VSB system. The design patterns used are the same as in first and second embodiments.

[Step 1]

According to the methods of the first and second embodiments, candidates for the characters for the CP exposure are extracted. The relation between the number of characters and the number of shots extracted in the first embodiment and optimized in the second embodiment will be shown in Table 3.

TABLE 3

Summary of Embodiments 1 and 2 (Calculation Results of Number of Characters and Number of shots)

| STRUCTURE | Number of Characters | CP Shot | VSB Shot |
|---|---|---|---|
| cell1 | (case1)1 | 29 | 2,088 |
| | (case2)2 | 17 | |
| cell5 | 1 | 256 | 262,144 |
| cell8 | (case1)1 | 29 | 3,132 |
| | (case2)2 | 17 | |
| char0 | 1 | 1 | 35 |
| char1 | 1 | 1 | 22 |
| char2 | 1 | 1 | 38 |
| char3 | 1 | 1 | 33 |
| char4 | 1 | 16 | 6,912 |
| char5 | 1 | 16 | 5,888 |
| Total | (case1)9 | 350 | 280,292 |
| | (case2)11 | 326 | | char0 = cell0 + hkds0, char1 = cell2 + hkds1
char2 = cell7 + hkds6, char3 = cell9 + hkds7
char4 = cell3 + cell4(upper) + hkds2 + hkds3
char5 = cell4(down) + cell6 + hkds4 + hkds5

[Step 2]

With regard to each STRUCTURE of Table 3, "CP effectiveness" defined in the equation below is calculated.

$$CP\text{ effectiveness} = \{(\text{Number of } VSB \text{ shots}) - (\text{Number of } CP \text{ shots})\}/\{(\text{Number of } CP \text{ shots}) \times (\text{Number of kinds of Characters})\}$$

Here, the number of kinds of Characters is the number of characters required for the exposure of CP system to the STRUCTURE, and the number of CP shots and the number of VSB shots are the numbers of shots required for the exposure to the STRUCTURE respectively.

For example, when calculating the CP effectiveness $E_{cell1,1}$ and $E_{cell1,2}$ of cell1 in case 1 and case 2, the results of:

$$E_{cell\ 1,1} = (2,088-29)/(29 \times 1) = 77.0$$

$$E_{cell\ 1,2} = (2,088-17)/(17 \times 2) = 60.9$$

are obtained, and these results indicate that a larger CP effectiveness is achieved when characters are extracted so that a smaller number of kinds of Characters may be achieved in stead of a smaller number of shots.

[Step 3]

When the characters capable of being used for the CP exposure are extracted in the order of the magnitude of the CP effectiveness calculated in Step 2 among all the characters, even in an exposure apparatus having a limit to the number of characters for the CP exposure, the number of shots can be reduced efficiently in comparison to an electron beam exposure method in which the VSB exposure is performed using the patterns unsuitable for the CP exposure.

In Table 4 there will be shown the total number of characters as well as the total number of shots of CP exposure and VSB exposure required when the CP effectiveness of each STRUCTURE in Table 3 is found, the STRUCTURES are arranged from above in the order of the magnitude of the CP effectiveness and each STRUCTURE is extracted as a character for the CP exposure in the order of the magnitude of the CP effectiveness.

TABLE 4

Extraction of Characters and Number of Shots According to CP effectiveness

| STRUCTURE | CP effectiveness | | Number of Characters | | Total Number of Shots | |
|---|---|---|---|---|---|---|
| | case1 | case2 | case1 | case2 | case1 | case2 |
| cell5 | 1023.0 | | 1 | | 18,404 | |
| char4 | 431.0 | | 2 | | 11,508 | |
| char5 | 367.0 | | 3 | | 5,636 | |
| cell8 | 107.0 | 91.6 | 4 | 5 | 2,533 | 2,521 |
| cell1 | 71.0 | 60.9 | 5 | 7 | 474 | 450 |
| char2 | | 37.0 | 6 | 8 | 437 | 413 |
| char0 | | 34.0 | 7 | 9 | 403 | 379 |
| char3 | | 32.0 | 8 | 10 | 371 | 347 |
| char1 | | 21.0 | 9 | 11 | 350 | 326 |

Table 4 shows that the total number of shots required for exposing the entire 128 k memory cell is 474 when the Characters extraction of case2 is performed in an electron beam exposure apparatus in which 5 characters can be used for the CP exposure. In contrast thereto, when the Characters extraction of case1 is performed, Table 4 shows that the total number of shots increases substantially to 2,521 in comparison to case1 even if the CP exposure using the same 5 characters is performed.

As described above, when the number of selectable CP characters is limited and all the patterns cannot be formed by means of the CP exposure, it is very effective for reducing the number of shots to use the CP effectiveness shown in this embodiment as a parameter and to extract characters suitable for an optimal CP exposure. Moreover, by forming the characters extracted according to this method by means of the CP exposure, it becomes possible to expect the largest throughput of an electron beam exposure apparatus used which is required in the specifications.

Further, as shown in Step 6 of the first embodiment, when there are a lot of choices of character selection, an optimal combination of characters can be determined easily and correctly using this CP effectiveness.

Having described the embodiments of the present, the present invention is not limited to these embodiments. For example, in the above-described embodiments, as design pattern data of device patterns for exposure (pattern data), ones of GDSII STREAM format are used, however, the design pattern data are not limited thereto.

The method of extracting characters described above may be performed using a computer-readable recording medium (for example, CD-ROM, DVD) having recorded a program for causing the computer to execute the specified procedures. In addition thereto, various modifications can be made without departing from the summary of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of extracting characters comprising:
    a first step of preparing design data having a hierarchy with regard to figure cells, the design data being design data of a device pattern for exposure; and
    a second step of extracting candidates for the figure cells corresponding to said characters from all levels of figure cells in said design pattern data by using the hierarchy with regard to the figure cells in said design pattern data, the candidates causing at least one of a number of kinds of characters and a number of shots of electron beams as a unit in performing an electron beam exposure of character projection system to be the smallest when said exposure is performed on at least a part of said device pattern.

2. The method of extracting characters according to claim 1, wherein said second step, with regard to the figure cells of all levels in said design data, further comprises finding, respectively, for the electron beam sizes which can be irradiated, the following values: the size of the figure cells, the number of kinds of characters, the number of shots of electron beams required in performing the exposure of character projection system, and the number of shots of electron beams required in performing the exposure of variable shaping beam system, and
    wherein candidates for the figure cells corresponding to said characters are extracted based on these values found.

3. The method of extracting characters according to claim 1, wherein
    said second step, candidates for the figure cells corresponding to said characters are extracted sequentially from the levels of a larger figure size to the levels of a smaller figure size based upon the magnitude of reduction of the number of shots of electron beams in comparison to the exposure of variable shaping beam system.

4. The method of extracting characters according to claim 1, wherein said second step, candidates for the figure cells corresponding to said characters are extracted sequentially from the levels of a larger figure size to the levels of a smaller figure size on the criterion that the number of kinds of characters required in performing the exposure of character projection system is smaller.

5. The method of extracting characters according to claim 1, further comprising:

a first extracting step of extracting adjacent single-arranged figure cells together as one character when there are single-arranged figure cells among the candidates for the figure cells corresponding to said characters, the adjacent single-arranged figure cells causing more figure cells to be included in electron beam sizes; and a second extracting step of extracting adjacent figure cells in one newly array-arranged figure cell together as one character when there are adjacent array-arranged figure cells which can be treated as said one newly array-arranged figure cell among the candidates for the figure cells corresponding to said characters, the adjacent figure cells in the newly array-arranged figure cell causing more figure cells to be included in the electron beam sizes.

6. The method of extracting characters according to claim 5, wherein said first extracting step of extracting characters is performed using arrangement position coordinates of said adjacent single-arranged figure cells described in said design data and an external form size found by means of the calculations of the adjacent single-arranged figure cells grouped together into said one character; and said second extracting step of extracting characters is performed using the arrangement position coordinates of said adjacent any-arranged figure cells described in said design data and the external form size found by means of the calculations of the figure cells grouped together into one character in said one newly array-arranged figure cell.

7. The method of extracting characters according to claim 3, wherein said second step, from among the candidates for the figure cells corresponding to said characters, a candidate permitting a more effective exposure of character projection system is extracted preferentially one by one.

8. The method of extracting characters according to claim 4, wherein said second step, from among the candidates for the figure cells corresponding to said characters, a candidate permitting a more effective exposure of character projection system is extracted preferentially one by one.

9. The method of extracting characters according to claim 7, wherein said second step, from among the candidates for the figure cells corresponding to said characters, a candidate to be extracted preferentially is selected one by one on the criterion of the number of kinds of characters, the number of exposure shots required In performing the exposure of character projection system, and the magnitude of reduction of the number of exposure shots required in performing the exposure of variable shaping beam system using said extracted candidates for the figure cells.

10. The method of extracting characters according to claim 8, wherein said second step, from among the candidates for the figure cells corresponding to said characters, a candidate to be extracted preferentially is selected one by one on the criterion of the number of kinds of characters, the number of exposure shots required in performing the exposure of character projection system, and the magnitude of reduction of the number of exposure shots required in performing an exposure of variable shaping beam system using said extracted candidates for the figure cells.

11. The method of extracting characters according to claim 7, wherein said second step, for each of the candidates for the figure cells corresponding to said characters, a CP effectiveness defined by means of the equation of {(Number of VSB shots)−(Number of CP shots)}/{(Number of CP shots)×(Number of kinds of Characters)} is found, the number of kinds of characters and the number of exposure shots required in performing an exposure by means of the electron beam exposure of character projection system being the number of kinds of Characters and the number of CP shots respectively, and the number of exposure shots required in performing the exposure of variable shaping beam system using said extracted candidates for the figure cells being the number of VSB shots, and a candidate having a larger value of said CP effectiveness is extracted preferentially one by one.

12. The method of extracting characters according to claim 8, wherein said second step, for each of the candidates for the figure cells corresponding to said characters, a CP effectiveness defined by means of the equation of {(Number of VSB shots)−(Number of CP shots)}/{(Number of CP shots)×(Number of kinds of Characters)} is found, the number of kinds of characters and the number of exposure shots required in performing an exposure by means of the electron beam exposure of character projection system being the number of kinds of Characters and the number of CP shots respectively, and the number of exposure shots required in performing the exposure of variable shaping beam system using said extracted candidates for the figure cells being the number of VSB shots, and a candidate having a larger value of said CP effectiveness is extracted preferentially one by one.

13. The method of extracting characters according to claim 11, wherein from among the candidates for the figure cells corresponding to said characters, a candidate having a larger value of said CP effectiveness is extracted preferentially one by one when the number of the candidates for the figure cells corresponding to said characters is larger than the number of the available characters.

14. The method of extracting characters according to claim 12, wherein from among the candidates for the figure cells corresponding to said characters, a candidate having a larger value of said CP effectiveness is extracted preferentially one by one when the number of the candidates for the figure cells corresponding to said characters is larger than the number of the available characters.

15. A program product for operating a computer, said computer program product comprising:

a first program instruction means for causing a computer to read in the design data including a hierarchy with regard to figure cells, the design data being design data of a device pattern for exposure; and a second program instruction means for extracting candidates for the figure cells corresponding to said characters from all levels of figure cells in said design pattern data by using the hierarchy with regard to the figure cells in said design pattern data, the candidates causing at least one of the number of kinds of characters and the number of shots of electron beams as a unit in performing an electron beam exposure of character projection system to be the smallest when said exposure is performed on at least a part of said device pattern.

* * * * *

UNITED STATES PATENT AND TRADEMARK OFFICE
CERTIFICATE OF CORRECTION

PATENT NO.    : 6,543,044 B2
DATED         : April 1, 2003
INVENTOR(S)   : Inanami et al.

It is certified that error appears in the above-identified patent and that said Letters Patent is hereby corrected as shown below:

Column 15,
Line 44, change "any-arranged" to -- array-arranged --.

Column 16,
Line 1, change "required In" to -- required in --.

Signed and Sealed this

First Day of July, 2003

JAMES E. ROGAN
*Director of the United States Patent and Trademark Office*